United States Patent [19]
Soderbarg et al.

[11] Patent Number: 5,977,609
[45] Date of Patent: Nov. 2, 1999

[54] METHOD AND APPARATUS FOR INSULATING MATERIAL USING TRENCHES

[75] Inventors: Anders Soderbarg, Uppsala; Nils Ögren, Vällingby; Håkan Sjodin, Knivsta; Mikael Zackrisson, Rimbo, all of Sweden

[73] Assignee: Telefonaktiebolaget LM Ericsson, Stockholm, Sweden

[21] Appl. No.: 09/045,819

[22] Filed: Mar. 23, 1998

[30] Foreign Application Priority Data

Mar. 26, 1997 [SE] Sweden .................................. 9701126

[51] Int. Cl.⁶ .................................................. H01L 29/00
[52] U.S. Cl. .......................... 257/510; 257/501; 257/506
[58] Field of Search .................................... 257/501, 506, 257/510, 517, 526

[56] References Cited

U.S. PATENT DOCUMENTS

| | | | |
|---|---|---|---|
| 5,148,247 | 9/1992 | Miura et al. .............................. | 257/510 |
| 5,561,073 | 10/1996 | Jerome et al. ............................. | 437/31 |
| 5,614,750 | 3/1997 | Ellul et al. ................................ | 257/386 |
| 5,661,329 | 8/1997 | Hiramoto et al. ........................ | 257/506 |

FOREIGN PATENT DOCUMENTS

| | | | |
|---|---|---|---|
| 07297273 | 11/1995 | Japan ............................ | H01L 21/76 |
| 2226445 | 6/1990 | United Kingdom ............ | H01L 27/04 |

OTHER PUBLICATIONS

Wolf, S., "Silicon Processing for the VLSI Era—vol. II", 1990, Lattise Press USA, pp. 45–56, Fig. 2.34 & 2.35.

*Primary Examiner*—Carl Whitehead, Jr.
*Assistant Examiner*—Jesse A. Fenty
*Attorney, Agent, or Firm*—Burns, Doane, Swecker & Mathis, L.L.P.

[57] ABSTRACT

An island of material has an insulating trench structure. The trench structure includes a first insulating trench surrounded by a second insulating trench. The trenches are joined together by at least two transverse linking trenches.

9 Claims, 4 Drawing Sheets

FIG. 3a
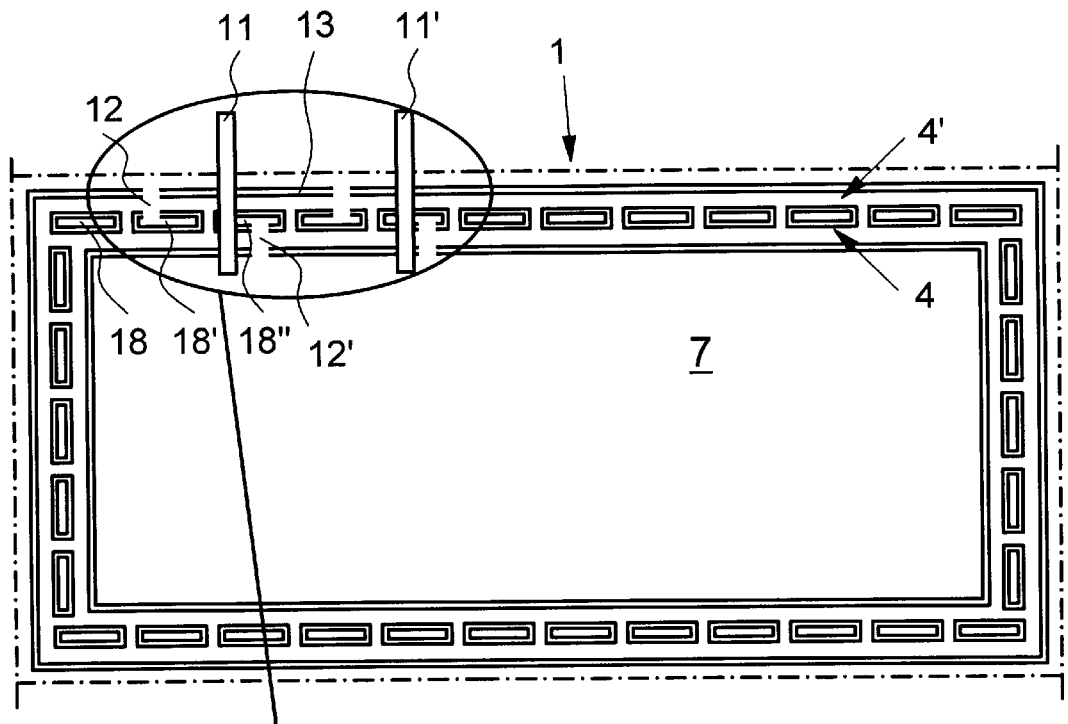
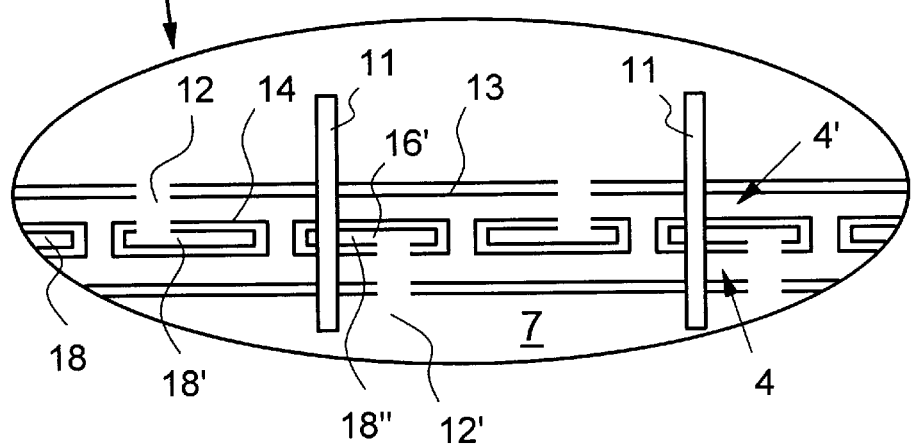
FIG. 3b

METHOD AND APPARATUS FOR INSULATING MATERIAL USING TRENCHES

This application claims priority under 35 U.S.C. §§119 and/or 365 to SE 9701126-6 filed in Sweden on Mar. 26, 1997; the entire content of which is hereby incorporated by reference.

BACKGROUND

The present invention relates to isolating trenches and methods of producing such trenches.

In order to isolate components in integrated circuits from each other refilled trench structures have been developed. There are many different ways of forming such trenches which can be etched through a silicon layer into an underlying buried insulating oxide layer or through a silicon substrate into an underlying silicon layer which has the opposite type of doping in relation to the layer which is to be laterally insulated. Methods of making such trenches are shown in Wolf, S., "Silicon Processing for the VLSI Era Volume II", pages 45–56, ISBN-0-961672-4-5, 1990, Lattice Press USA.

A problem with the use of trenches for isolating components is that the small width of the trenches make them vulnerable to foreign particles or defects in the material, both of which can short circuit the desired electrical insulation. This is particularly difficult to cure in the case of components having long total trench lengths. Another problem with trench structures is that the different thermal properties of the materials in and surrounding the trenches can lead to mechanical stresses occurring in the trench material or the surrounding silicon. A further problem with trench structures is that steps are often formed over trenches during their manufacture. These steps can trap conductive material in undesirable regions during subsequent processing and can cause short circuits. An example of such undesirable conductive material is polysilicon strings which remain in the trench edges and can go all the way around a component. These strings can then cause short circuits between two conductors which cross the trench and are in contact with the strings.

SUMMARY

An object of the invention is to produce trench structures with a reduced risk for short-circuiting crossing conductors and a greater tolerance of foreign particles and defects in the material.

In accordance with the invention, this is achieved by means of a trench structure having a segmented structure.

A trench formation formed in accordance with the invention has a number of advantages. One advantage is that a short circuit can only occur if two defects or foreign particles occur close to each other. This risk is considerably lower than the risk that two defects or foreign particles occur on a simple trench which completely surrounds a component.

Another advantage is that the reduced length of the islands of silicon surrounded by the trenches helps relieve the mechanical stresses which are generated during subsequent processing and use.

A further advantage is that there is a reduced risk that conducting residues, for example strings of polysilicon, remaining from later process steps surround the insulated device and short circuit conductors which cross the trench.

Yet another advantage is that the thermal insulation of the trench formation according to the invention is greater than that of a single trench and thus the conduction of heat to components surrounded by a trench formation according to the present invention is reduced.

BRIEF DESCRIPTION OF THE DRAWINGS

The invention is described below by means of examples of embodiments which are illustrated in the following figures in which:

FIG. 1b) shows an enlarged view of a cross-section along line I—I in FIG. 1a,

DETAILED DESCRIPTION

Figure 1A:
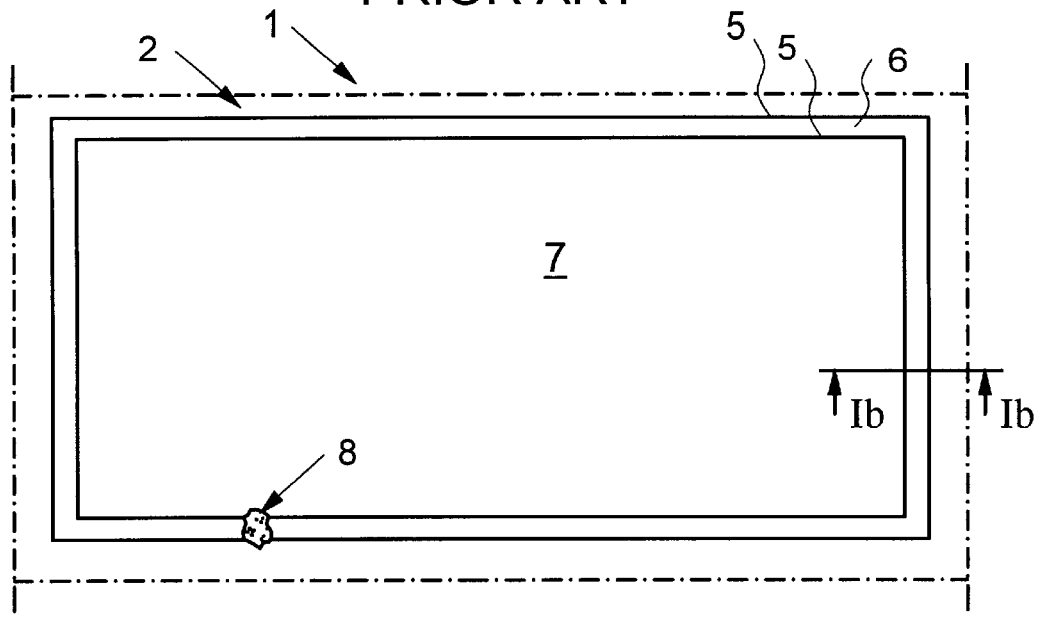
FIG. 1a) shows a plane view of a prior art trench structure.
Figure 1B:
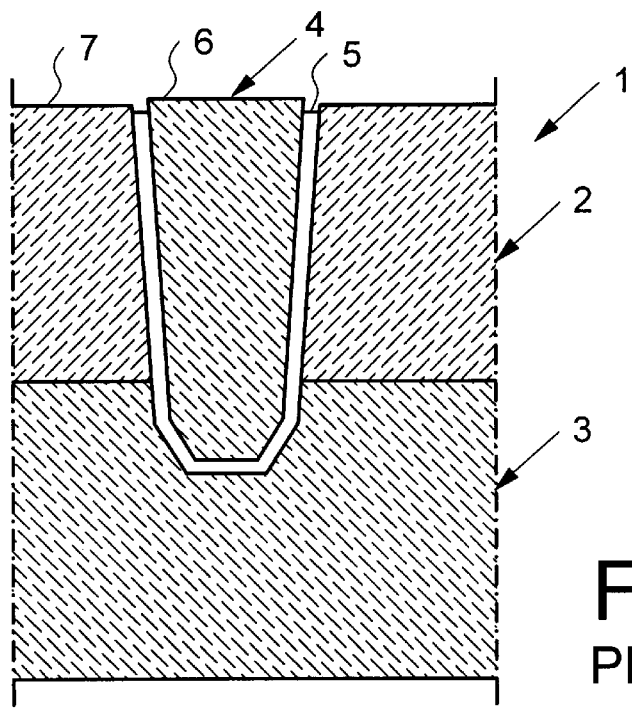

In the prior art trench structure shown in FIG. 1 a wafer 1 for producing semiconductor devices has a layer 2 of, for example, doped silicon, for example, n-type doped silicon over a layer 3 of oppositely doped, in this case type, silicon. The water has a continuous or closed-loop trench 4. This trench 4 has a U-shaped cross-section which extends from the upper surface of wafer 1 through layer 2 into layer 3. Trench 4 has insulating walls 5 made of, for example, oxidised silicon and a filling of polysilicon 6 between the trench walls 5. Trench 4 extends along the boundary between an island 7 of n-type doped silicon and the rest of the n-type doped silicon 2 and insulates it from the rest of the n-type doped silicon 2. This island 7 can be used as the foundation for one or more components (not shown) such as resistors, capacitors, diodes, transistors and other bipolar components. In the event of a conducting foreign particle or defect in the material (which for the sake of brevity will be called foreign particle from now on) 8 bridging the trench 4 then island 7 will be in undesired electrical contact with layer 2 and the function of any component(s) formed on or by island 7 will be adversely affected.

Figure 2A:
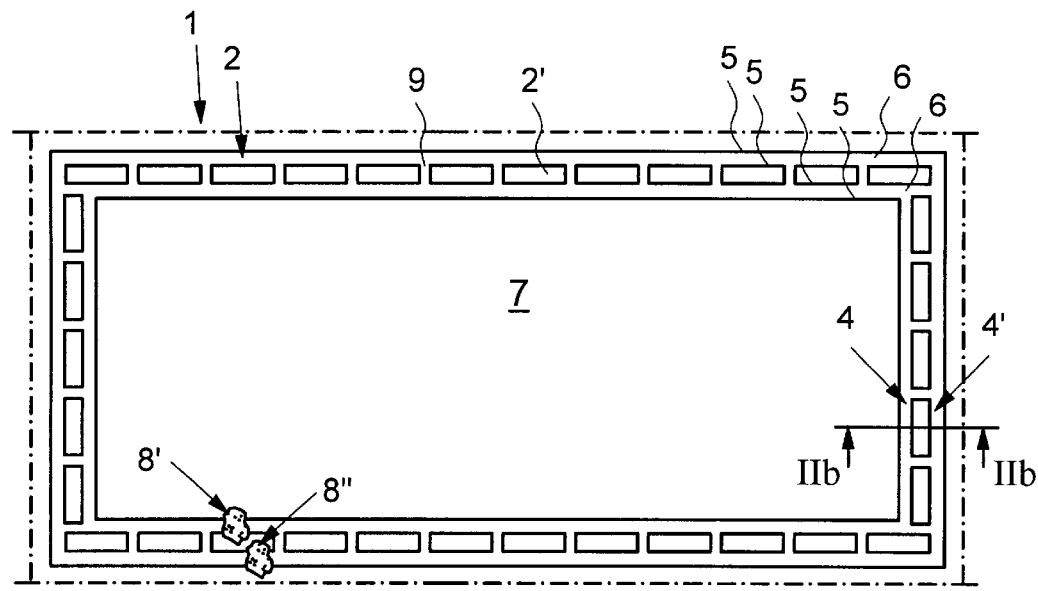
FIG. 2a) shows a plane view of one embodiment of a trench structure according to the invention, FIG. 2b) shows an enlarged view of a cross-section along line II—II of the trench structure show in FIG. 2a, FIG. 3a) shows a plane view of a second embodiment of a trench structure according to the invention, FIG. 3b) shows an enlarged view of a part of the trench structure of FIG. 3a).
Figure 2B:
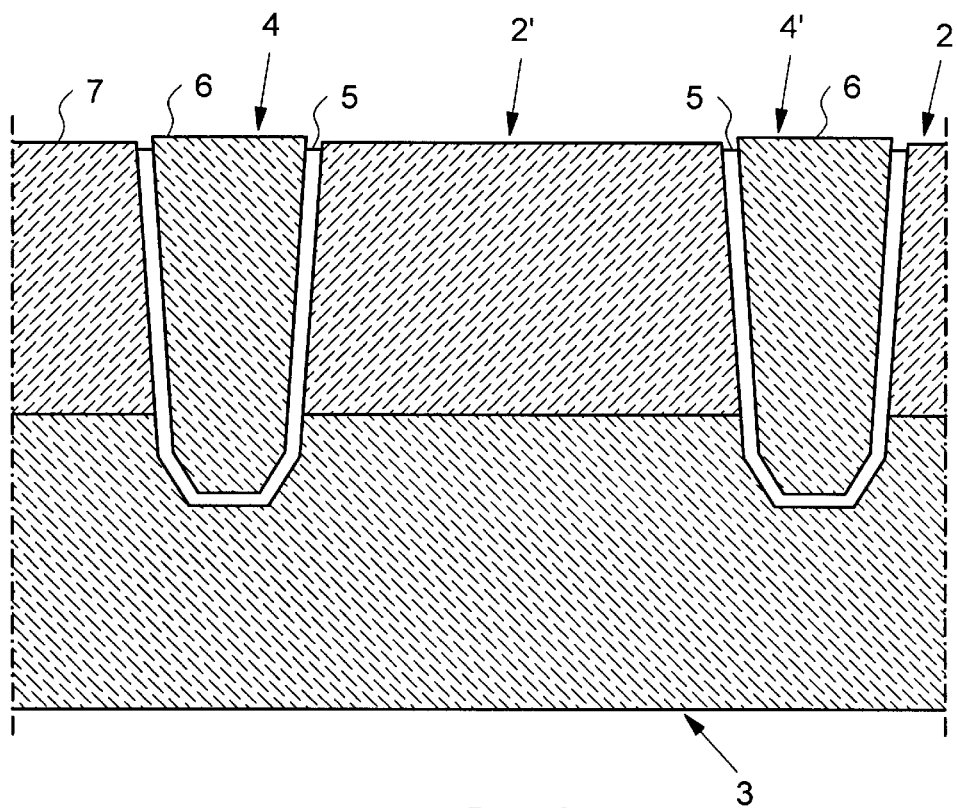

FIGS. 2a) and 2b) show an embodiment of a trench structure according to the present invention. In this embodiment first closed loop trench 4 is surrounded by a second closed loop trench 4' and separated from it by an island or slice of, for example, n-type doped silicon 2'. The invention is not limited to silicon based components but can be adapted as required for use with any material. It is also possible to adapt it for use with other manufacturing processes such as silicon on insulator (SOI) technology in which a layer of silicon is provided on a insulating substrate made of, for example, silicon oxide. Trenches 4, 4' have insulating walls 5 made of, for example, oxidised silicon and a filling of polysilicon 6 between the trench walls 5. The material of the insulating walls 5 can be any suitable material such as silicon nitrides, silicon oxides, porous silicon, sapphire, aluminium oxide, aluminium nitride, diamond, quartz, other dielectric materials and combinations of the same and it is conceivable that a material other than polysilicon or no material is present between the insulating walls 5. Second trench 4' is constructed in the same way as trench 4 and is appropriately formed simultaneously with trench 4. It is joined to first trench 4 by intermediate transverse trenches 9 formed in the slice of n-type doped silicon 2' and spaced, in this example, at predetermined regular intervals around the circumference of trench 4. It is naturally also possible to have irregularly spaced transverse trenches 9. With such an arrangement of two trenches 4, 4' linked by transverse trenches 9 in a chain-like structure not only does it need one or more foreign particles 8' to bridge the trench 4 between island 7 and the slice of n-type silicon 2' as well as one or more foreign particles 8" to bridge the trench 4' between slice 2' and layer 2 but also these foreign particles 8', 8" must be present between two adjacent transverse trenches 9 before island 7 is brought into electrical contact with layer 2. The risk of this occurring is substantially less than the risk that a single particle will bridge a single trench.

The optimum number of transverse trenches 9 depends on the expected sizes of foreign particles and how often they occur. With very rare foreign particles then it may be sufficient to have only two transverse trenches. As the risk of contamination in the form of foreign particles increases then it may become advisable to increase the number of transverse trenches 9.

Furthermore the links forming the chain-like structure do not have to be elongated links but could be any appropriate shape such as round, oval, square, trapezoidal etc. Typical lengths for the trenches 4, 4' forming the sides of links could be 15–50 micro-meters with a width of 1–3 micro-meters. The distance between two trenches could typically be from 3–50 micro-meters.

While the invention has been illustrated by examples in which the trench structure is formed of continuous trenches it is of course conceivable that components mounted near the edge of a substrate would be protected by trench structures which did not extend along the edge of the substrate.

FIG. 3a) shows an embodiment of the invention in which the problem that residual conductive material such as polysilicon 13, remaining along the trench edges can cause short-circuiting between conductors crossing the trenches can be avoided FIG. 3b) is an enlargement of part of FIG. 3a). Polysilicon 13 is represented in FIGS. 3a) and 3b) by double lines on the circumference of the shaded trenches. Conductors 11, 11' at different potentials both cross trench structures 4, 4'. If there is any un-oxidised polysilicon remaining along the edges of the trenches then this will act as a conductor between conductors 11, 11' and the island 7 will be short-circuited. In order to prevent this a break 12 is formed in trench 4 in each portion of trench 4 which joins the conductors 11, 11'. Each break 12 extends into one of the islands 18' formed between trenches 4, 4'. Similarly a break 12' is formed in trench 4' in each portion of trench 4' which joins the conductors 11, 11'. Each break 12' extends into one of the islands 18" formed between trenches 4, 4'. These breaks 12, 12' are made by leaving a gap in the masks used to produce the trenches so that the original n-type doped silicon which is oxidised, coated with a deposit of polysilicon and subsequently etched back during the formation of the trenches 4, 4' is left with an insulating layer of oxide. Normally polystrings (that is, continuous lengths of polysilicon) are formed at the edges of the trenches where there is a step in the planar surface. It has however been found that corners, particularly convex corners 16', which occur where the breaks meet the trenches cause an accelerated etching of polysilicon. This means that during the usual process of etching back unwanted polysilicon any polystrings which are present at or near to the corners are automatically broken by being etched away. This prevents polystrings on the outside perimeter of the trenches from being in electrical contact with polystrings on the inside perimeter of the trenches. Break 12, 12' thus form insulating breaks in any strings of conducting material and thereby ensure that conductors 11, 11' are isolated from each other. In order to ensure that the conductors 11, 11' are isolated, each trench 4 must have at least two breaks 12 in it and each trench 4' must have at least two breaks 12' in it. Each pair of breaks 12,12' must be positioned on opposite sides of a conductor 11, or 11' such that there is no continuous conducting path between the conductors 11, 11'. In other words, one break must be in the long path between the conductors 11, 11' which path goes around almost all of the perimeter of island 7 and the other break must be in the shortest path between the conductors 11, 11'.

In another embodiment of the invention, not shown, instead of having four staggered breaks 12, 12' as shown in FIGS. 3a) and 3b) it is conceivable that the four breaks are aligned such that appear to be form two lengthened breaks Which both extend simultaneously across both trenches 4, 4'.

Figure 4:
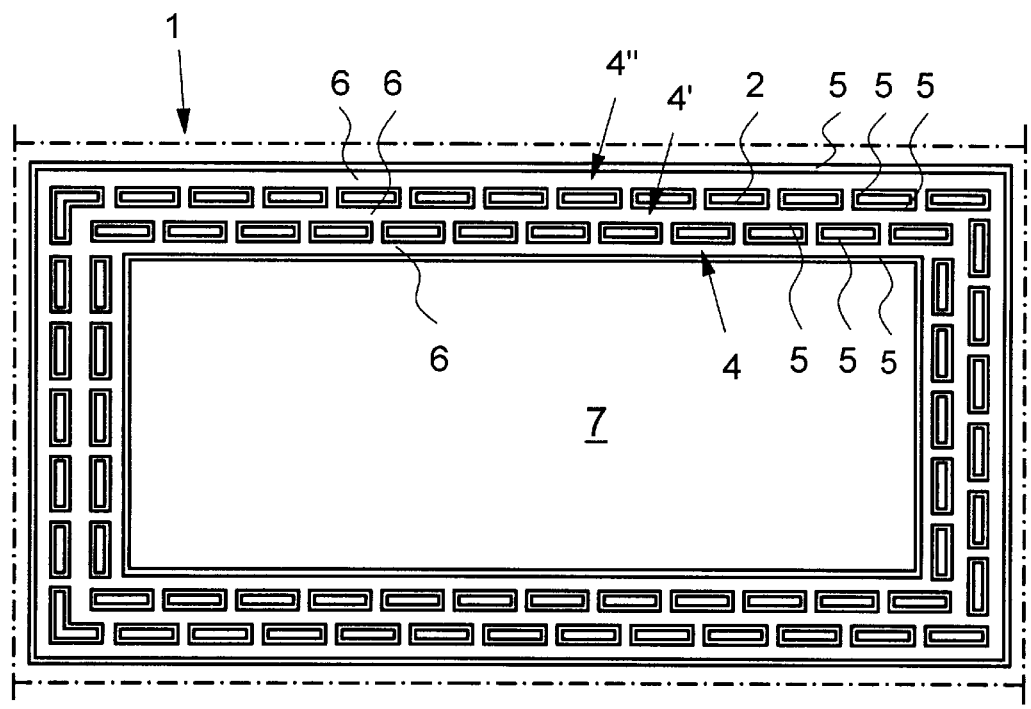
FIG. 4 shows a third embodiment of a trench structure according to the invention.

As shown in FIG. 4, the invention could also be realized with 3 trench structures 4, 4', 4" of increasing size arranged around a component to be protected The invention is not limited to the embodiments described above but could include more than 3 trench structures. These trench structures could be all interconnected by transverse trenches or alternatively could be interconnected into groups wherein each group is not interconnected to the other group or groups.

In order to realize the fill electrical Isolating benefits of a trench structure according to the invention, it is preferable that the islands 2' formed between the trenches 4, 4', 9 should be designed to not be in electrical contact with any active conductors 11, 11' although it may be necessary to provide them with a connection to earth. Thus the masks used during processing of the wafer 1 should not have any contact holes between the islands 2' and any active conductors 11, 11'.

As well as providing improved electrical insulation a trench structure according to the invention provides increase thermal insulation between the components on either side of it.

Furthermore the provision of transverse trenches provides multiple paths for the relief of stresses. This reduces the risk of stress damage occurring as the stress travels a shorter path before being relieved.

The insulating material can be any suitable material such as silicon nitrides, silicon oxides, porous silicon, sapphire, aluminium oxide, aluminium nitride, diamond, quartz, other dielectric materials and combinations of the same.

According to a flirter embodiment of the invention the trench structures surround a silicon-based or other semiconductor-based substrate and extend down to a buried isolating layer to form a complete galvanic isolation around the substrate The buried isolating layer can natural be formed of any suitable insulating material, including that used for the trench structures.

We claim:

1. Method for insulating an island of material from a surrounding material, wherein the boundary between said island and said surrounding material is crossed by two or more conductors, the method comprising the steps of:

forming a plurality of insulating trenches between said island and said surrounding material, wherein a first said insulating trench is connected to a second said insulating trench by insulating transverse trenches in at least two places, whereby islands of the surrounding material are formed between trenches; and forming a break in each trench between a pair of conductors.

2. Island of material insulated from surrounding material by an insulating trench structure, wherein said trench structure is crossed by two or more conductors, said trench structure comprising a plurality of trenches containing insulating material, wherein a first trench is surrounded by a second trench containing insulating material, said second trench is connected to said first trench by insulating transverse trenches in at least two places, whereby islands of the surrounding material are formed between trenches and said trench structure further comprises a break in each trench between a pair of conductors.

3. Island of material according to claim 2, wherein the number of said trenches is only two.

4. Island of material according to claim 2, wherein the number of trenches is greater than two.

5. Island of material according to claim 2, wherein a trench is connected by insulating transverse trenches, in at least two places to each trench adjacent to it.

6. Island of material according to claim 2, wherein a trench is connected by insulating transverse trenches, in at least two places, to only one trench adjacent to it.

7. Island of material according to claim 2, wherein said component is a bipolar component.

8. Island of material according to claim 2, wherein it comprises a buried insulating layer on a substrate of silicon or an isolator.

9. Island of material according to claim 2, wherein said islands are not in electrical contact with said conductors.

* * * * *